United States Patent [19]
Vig et al.

[11] Patent Number: 5,686,894
[45] Date of Patent: Nov. 11, 1997

[54] TWO TERMINAL I.C. MAGNETIC-FIELD DETECTOR FOR USE IN A LIQUID LEVEL SENSOR AND HAVING AN ANTI-SLOSH FEATURE

[76] Inventors: Ravi Vig, 27 Longview Dr.; Teri Tu, 15 Clough St., both of Bow, N.H. 03304; Alberto Bilotti, M. Haedo 2551, Florida 1602, Argentina

[21] Appl. No.: 582,570

[22] Filed: Jan. 3, 1996

[51] Int. Cl.⁶ .................. H01H 35/18; G01F 23/36
[52] U.S. Cl. ................. 340/618; 340/624; 377/21
[58] Field of Search ........................ 340/618, 624, 340/623, 625; 377/21, 45

[56] References Cited

U.S. PATENT DOCUMENTS

| | | | |
|---|---|---|---|
| 3,983,549 | 9/1976 | Akita et al. | 340/618 |
| 4,361,835 | 11/1982 | Nagy | 340/618 |
| 4,967,181 | 10/1990 | Iizuka et al. | 340/618 |
| 5,257,300 | 10/1993 | Bennett et al. | 340/618 |
| 5,426,271 | 6/1995 | Clark et al. | 340/625 |

*Primary Examiner*—Jeffrey Hofsass
*Assistant Examiner*—Davetta Woods

[57] ABSTRACT

A two-terminal integrated circuit magnetic-field detector, for use in detecting a low level of a liquid in a vehicle, has a Hall element, a Schmitt type comparator, an anti-sloshing accumulator such as an up-down counter, and a latching driver all connected in tandem. The anti-sloshing accumulator is for producing a signal that is the integral as a function of time of the binary comparator output signal. During sloshing, when the average liquid level is near that at which a low-level warning signal is desired, the accumulator signal climbs in a vacillating manner. The latching driver is connected across the two integrated circuit (I.C.) terminals and latches on when the accumulator signal reaches a predetermined value, dropping the impedance across the two I.C terminals. A liquid level indicating lamp is connected in series with a source of DC voltage and the two I.C. terminals, so that when the average position of the floating magnet approaches that of the I.C. detector, the driver latches on and the low-level indicating lamp is also turned on and cannot be turned off except by removing the DC energizing voltage. The accumulator may be an up-down counter with means for preventing counting in the over-flow mode, and also for preventing counting in an under-flow mode, namely downward counting below zero count.

12 Claims, 6 Drawing Sheets

TWO TERMINAL I.C. MAGNETIC-FIELD DETECTOR FOR USE IN A LIQUID LEVEL SENSOR AND HAVING AN ANTI-SLOSH FEATURE

BACKGROUND

This invention relates to a two terminal integrated circuit Hall switch for use in a vehicle, and more particularly relates to such a Hall switch for detecting a low level of a floating magnet, and having an anti-slosh feature.

In the prior art liquid level sensor of FIG. 1, a container 10 contains a liquid 11 (such as gasoline, engine oil, brake fluid, transmission fluid, windshield washing liquid, etc.). A low density float 12 is fixed to the end of a shaft 13, the other end of the shaft 13 being hingedly connected to wall of the container 10 such that the float 12 remains close to the opposite wall of the container when the level of the liquid 11 is low. A magnet 14 is mounted to the end of the float 12 and a reed switch 15 is mounted to the outside of the container wall at a low level. The reed switch 15 is of the kind that closes the circuit when the ambient magnetic field exceeds a predetermined strength. Thus when the level of liquid 11 is such that the magnet 14 is about at the level of the its closest point to the reed switch 15, the circuit is closed and the warning lamp 16 is illuminated indicating that the container 10 is about empty of fluid 11.

The effect of sloshing of the liquid, due to changes in vehicle movement, is to cause the liquid-level indicator to repeatedly turn off and on giving an ambiguous indication of the liquid level. It is known to ameliorate the effect of liquid sloshing by adding a delay circuit in series with the indicator lamp, or to add baffles in the liquid tank to ameliorate the sloshing itself (neither of which is shown in FIG. 1).

The great majority of integrated Hall detectors for sensing magnetic fields, have at least a DC supply voltage terminal, a ground terminal and an output terminal.

The use of the well known three wire Hall switches to detect levels of a floating magnet is described in the patent U.S. Pat. No. 4,361,835 to B. G. Nagy, issued Nov. 30, 1982.

In the patent U.S. Pat. No. 4,296,410 to J. K. Higgs, issued Oct. 20, 1981, a Hall-switch detector having three terminals is mounted adjacent a lamp that is connected to the detector output and turned on to indicate an ambient magnetic field exceeding a predetermined amplitude.

An integrated circuit Hall-switch detector having only two terminals, e.g. two terminal pads requiring only two wires connected to the I.C., is described in the patent U.S. Pat. No. 4,374,333 to G. D. Avery, issued Feb. 15, 1983. The two wires are for providing both the DC supply voltage from a remote source to energize the Hall device and associated detector circuits, as well as for conveying the output signal which is a step change in current through the two connecting wires, and which step change in current is discernable in the two wires at a point remote from Hall-switch detector.

In the patent U.S. Pat. No. 4,791,311 to R. Vig, issued Dec. 13, 1988, there is described a multiplexible two terminal Hall-switch detector of this kind, a plurality of which may be connected in parallel to a common source of DC voltage; each of the remote sensors is capable of being addressed sequentially by coded changes in the DC voltage level, and the detector responses are sequentially read at the common DC voltage source.

The above mentioned patents are assigned to the same assignee as is the present invention.

It is an object of this invention to provide a two terminal integrated circuit Hall switch, that may be installed in a vehicle for detecting the proximity of a floating magnet e.g. in the windshield-washing detergent tank, that produces an output signal that is relatively insensitive to liquid level variations caused by liquid sloshing.

It is a further object of this invention to provide such a two terminal integrated circuit capable of causing an indicator lamp, or another high power consuming indicator that is connected in series with the two terminal pads and a DC voltage source, to be energized upon detection of the proximity of the floating magnet.

It is yet a further object of this invention to provide such a two terminal integrated circuit that when once latched on remains latched on until the DC voltage source has been disconnected and reconnected with the integrated circuit.

SUMMARY OF THE INVENTION

A two-terminal integrated circuit magnetic-field detector is for use in detecting the proximity of a floating magnet. It includes a magnetic-field-to-voltage transducer, such as a Hall element or a magneto-resistor bridge. A binary-output comparator, such as a Schmitt trigger circuit having hysteresis has an input connected to the output of the transducer. An anti-sloshing accumulator means, having an input connected to the comparator output, is for producing an accumulator signal that is the integral as a function of time of the binary comparator output signal when the binary comparator output signal is of the one type, and for reducing the integrated accumulator signal at a predetermined rate during periods when the binary comparator output signal is of the other type.

Two integrated circuit terminal pads are provided to which an external DC voltage source may be connected in series with an external warning lamp. The magnetic-field-to-voltage transducer, the comparator and the up-down accumulator means are connected to the two terminal pads for being energized by the external DC voltage source. A latching driver is connected between the two integrated circuit terminal pads and has an input connected to the accumulator means. The driver has a latch threshold for presenting a high impedance across the terminal pads when the accumulator signal is in one binary state and for presenting a low impedance across the two terminals when the magnitude of the accumulator signal exceeds a predetermined value.

In one embodiment, the anti-sloshing accumulator means is comprised of a clock for generating a stream of pulses and an up-down counter. The clock is connected to the counter, and the counter is for counting the pulses in an additive direction when the binary comparator output signal is of the one type whereby the count signal is the accumulator signal. The counter is additionally for counting the pulses in the subtractive direction when the binary comparator output signal is of the other type, and for producing a binary accumulator output signal of one binary type to the latching driver only when the magnitude of the accumulator signal exceeds the predetermined value.

The accumulator means may also include an under-flow circuit means for stopping accumulation whenever the accumulator output signal falls to zero and holding the output at zero until the next one type binary signal from the comparator appears at the accumulator input. It may additionally include an over-flow circuit means for stopping accumulation whenever the accumulator count signal reaches the predetermined count value and holding the accumulator output signal at the one binary type level until the next other type binary signal from the comparator appears at the accumulator input.

This invention provides a magnetic-field proximity detector as an improved alternative to the switch 16 in the prior art liquid level detector of FIG. 1. Achievement of the above-noted objects of this invention is confounded by the fact that any integrated circuitry which provides a very low impedance between the two integrated circuit terminal pads to electronically switch on a heavy load such as a lamp will tend to essentially short out the energizing DC voltage across the two integrated circuit terminal pads and render that circuitry nonfunctional. The magnetic-field detector of this invention overcomes this problem.

DESCRIPTION OF THE PREFERRED EMBODIMENTS

Figure 1:
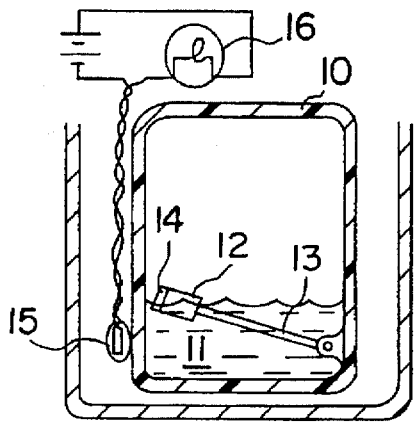
FIG. 1 shows a liquid level sensor of the prior art mounted in a liquid containing tank with a floating magnet.
Figure 2:
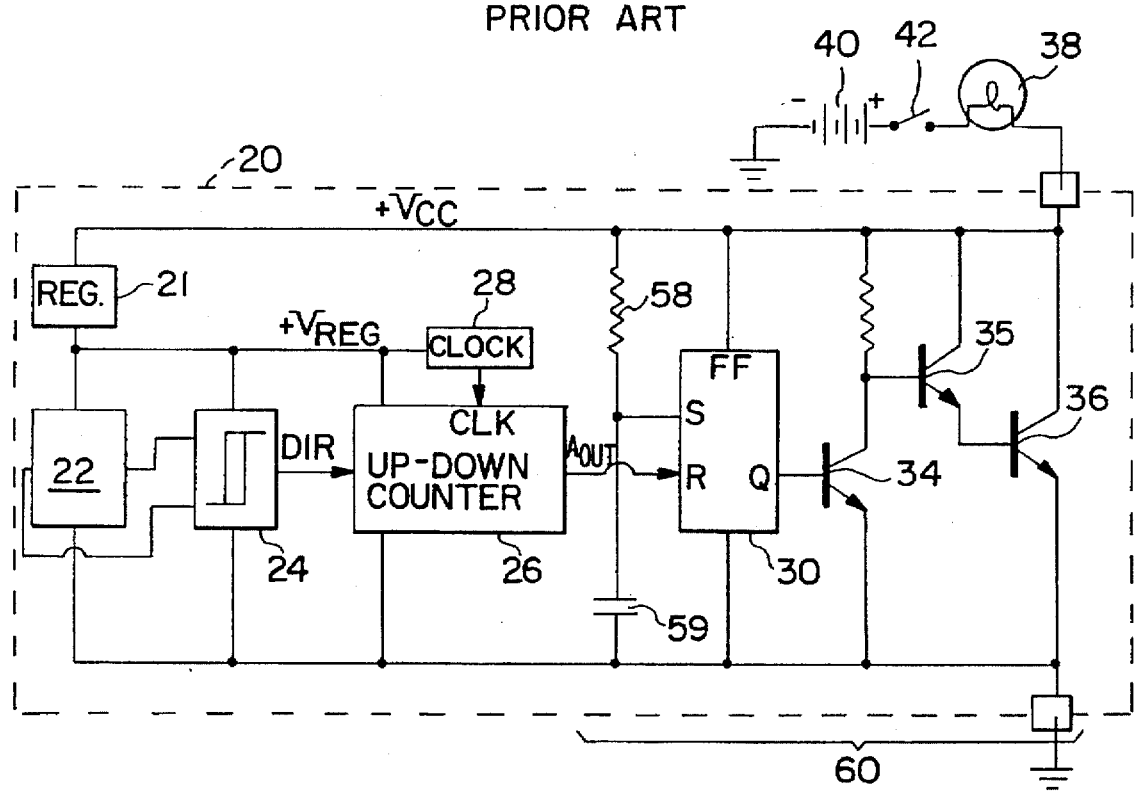
FIG. 2 shows circuit diagram of a first preferred integrated circuit two-terminal magnetic-field detector of this invention for use in a liquid level sensor with a floating magnet.

In a first embodiment of this invention illustrated in FIG. 2, a two terminal integrated silicon circuit chip 20 has an on-board DC voltage regulator 21 for producing a regulated voltage $V_{reg}$. Chip 20 also has a magnetic-field-to-voltage transducer 22 with an output connected to a comparator 24 which may be a standard Schmitt trigger circuit. Comparator 24 may include an amplifier (not shown) and provides a binary output signal that is high when a magnet approaches and the ambient magnetic field is strong enough that the transducer output exceeds a threshold voltage of the comparator 24. The comparator output becomes low, or zero, when the magnet is far enough away that the transducer output is less than the "release" threshold of comparator 24.

The output of comparator 24 is connected to an up-down accumulator, which in this embodiment is a clocked up-down counter 26. Clock pulses are provided to the counter 26 from a free running clock 28. The up-down counter counts the number of (high) clock in the output signal from the comparator 24. And during periods when the output signal from comparator 24 is low, the up-down counter 26 counts clock pulses backward, i.e. counts clock pulses by subtracting from the clock-pulse count accumulated during the previous high output comparator signals.

Figure 6:
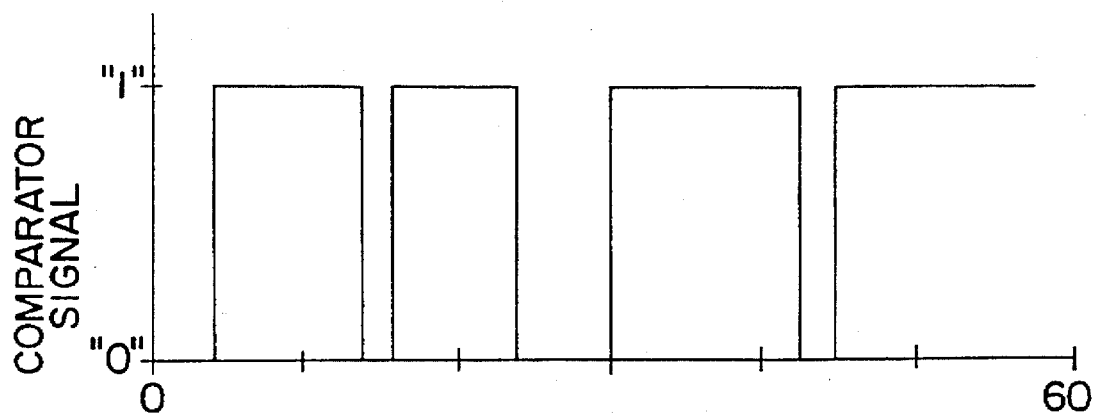
FIG. 6 shows, as a function of time, a waveform of the binary signal at the output of the comparator in the integrated circuit two-terminal magnetic-field detector of FIG. 2, which detector is used in a liquid level sensor in which sloshing of the liquid occurs.
Figure 7:
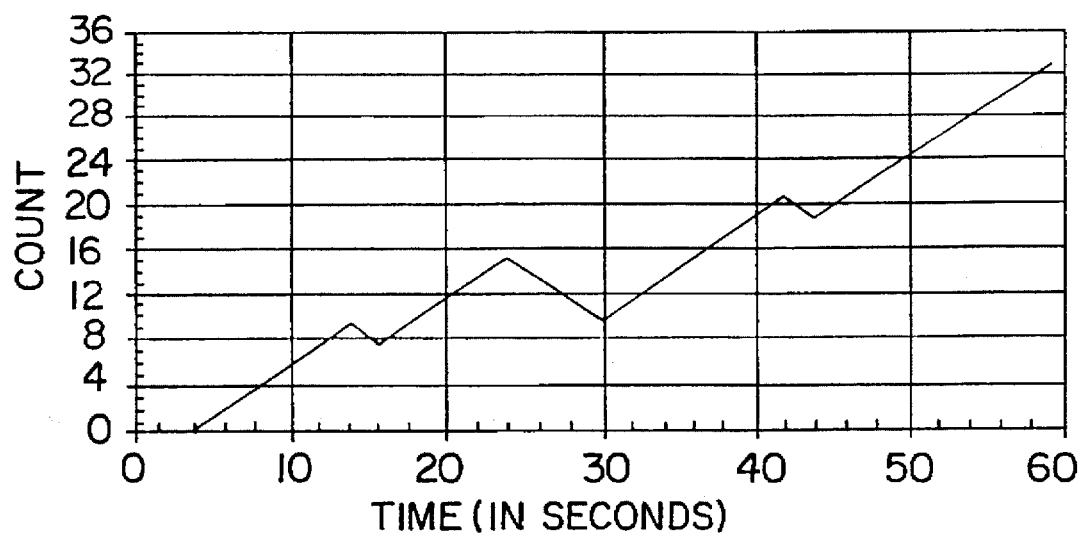
FIG. 7 shows a plot of the accumulated count in the up-down counter of FIG. 2, corresponding to the same time period for which the comparator output is waveform is shown in FIG. 6.
Figure 8:
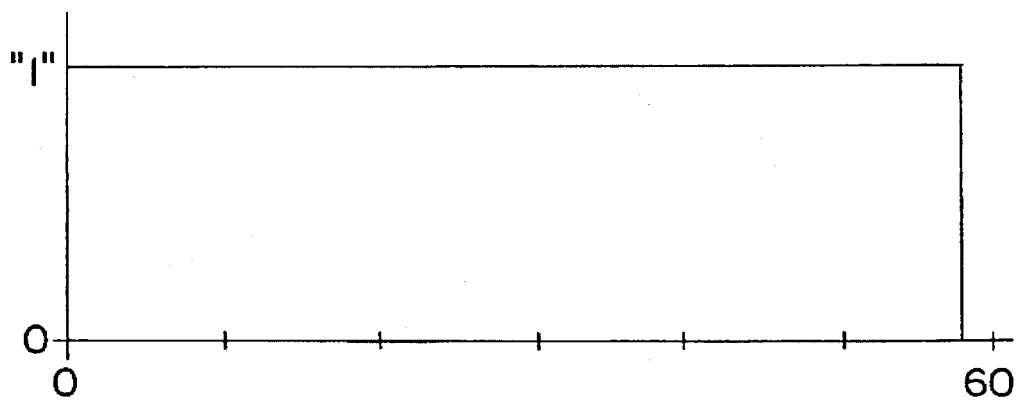
FIG. 8 shows a plot of the binary signal at the output of the up-down counter of FIG. 2, corresponding to the same time period for which the comparator output is waveform is shown in FIG. 6.

The present invention is especially concerned with the detection and warning of low liquid level in a tank of a vehicle. During a time when the vehicle and the liquid container are still, and when the liquid level is not quite low enough for the ambient magnetic field strength at the integrated circuit chip 20 to trigger the comparator 24 and produce a high comparator output signal, the counter will remain inactive holding a zero count. But for the same low level of the liquid, when the vehicle gets under way the liquid tends to slosh back and forth. The result is a series of high pulses in the comparator output signal as are illustrated in FIG. 6, and the counter 26 responds by counting "upward" during high pulses from the comparator 24 and counting "downward" during periods when the comparator output is low, as illustrated in FIG. 7.

For example, the clock 28 operates at about 0.5 Hz, which low clock frequency may be achieved by providing in the clock a 500 KHz oscillator (not shown) followed by a 17 bit divide down circuit (not shown). The up-down counter 26 is a five bit counter, so when the net accumulated upward count in counter 26 reaches the count 32, the counter output signal changes from a binary high to a binary low and resets the flip flop, or latch, 30. Latch 30 then produces a binary low at the Q output and turns off transistor 34. This in turn causes the Darlington connected transistors 35 and 36 to turn on and the lamp 38 now shines brightly.

In this instance, sloshing was delayed from resetting the latch for almost a minute. But, over this time the up counts exceeded the down counts because the average liquid level was low enough in a still situation to have reset the latch and illuminated the lamp 38 in about 40 seconds, as seen by extrapolating the slope of upward count assuming no downward counts in FIG. 7.

The 12 volt rated incandescent lamp 38 shines brightly because the two terminal integrated circuit 20 changes from a high impedance state (presented by the regulator 28) to a low impedance state presented by the saturated darlington driver composed of transistors 35 and 36. Thus when the lamp 38 is switched on, Vcc is about +1.2 volts and the voltage at the lamp 38 is +10.8 volts. But, with Vcc being only 1.2 volts, the transducer 22, the comparator ¦24 and counter 26 become disabled. If latch 30 could not continuously hold off transistor 34, then transistors 35 and 36 would turn off immediately after having just turned on.

Figure 3:
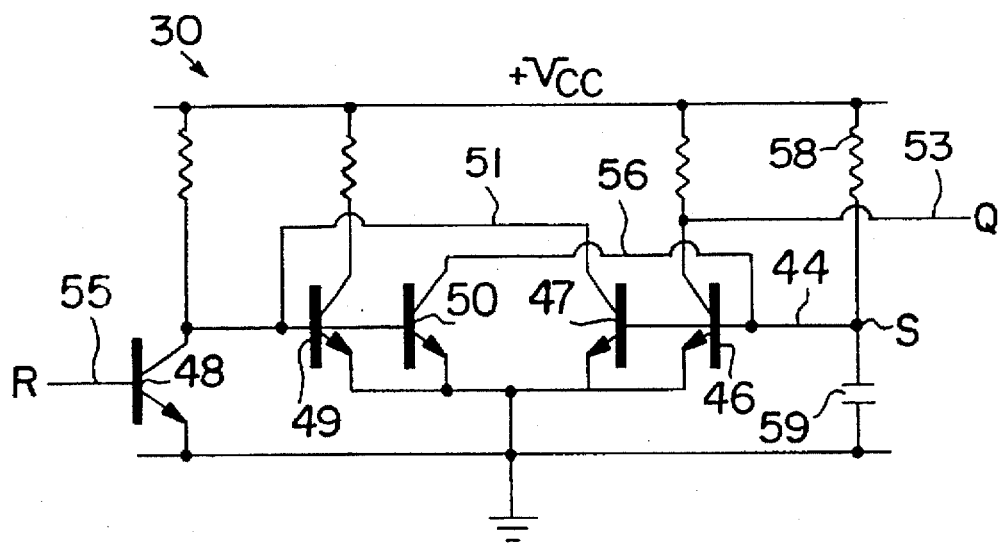
FIG. 3 shows a circuit diagram of the flip flop employed in the two-terminal magnetic-field detector of FIG. 2.

The latch 30 employed in the latched driver circuit 60 of FIG. 2 is a low overhead latch circuit as shown in FIG. 3 which does not become disabled when the switching transistors 35 and 36 are conducting and energizing the lamp. When power is first applied to the circuit, +Vcc is instantly applied to the bases of transistors 49 and 50, and only later when capacitor 59 has charged to the +Vcc applied to transistors 46 and 47. This assures a particular state of the latch whereby the Q output 53 of the latch 30 is held high at start up. When a binary high signal is then applied to the reset input conductor 55, transistor 48 is held on, transistors 49 and 50 are held off and via conductor 56 the transistors 46 and 47 are held on.

This latch circuit 30 can operate reliably with an energizing voltage, Vcc, as low as about 0.8 volts, e.g. during periods when the driver transistors 35 and 36 are conducting and DC supply voltage Vcc is very low. The latched driver 60 can only be reset off by turning off the supply voltage Vcc, namely by opening the ignition switch 42.

All of the circuitry shown to the right of the up-down counter 26 in FIG. 2 may be considered a latching driver 60 that turns on when a binary signal exceeding a given level is momentarily applied to the latching driver input (e.g. the reset input of the flip-flop latch 30).

Figure 5:
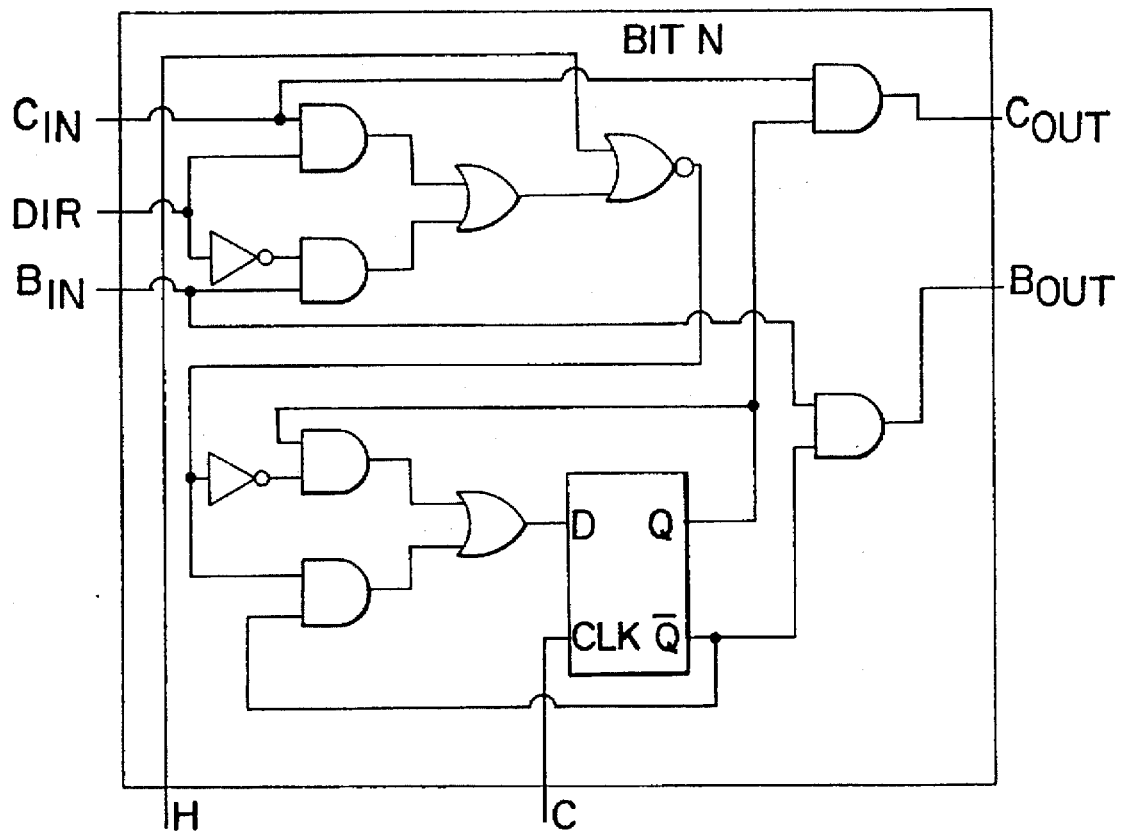
FIG. 5 shows a circuit diagram of a counter stage that is the circuitry in the blocks labeled BIT 1 through BIT N of the up-down counter of FIG. 4.
Figure 4:
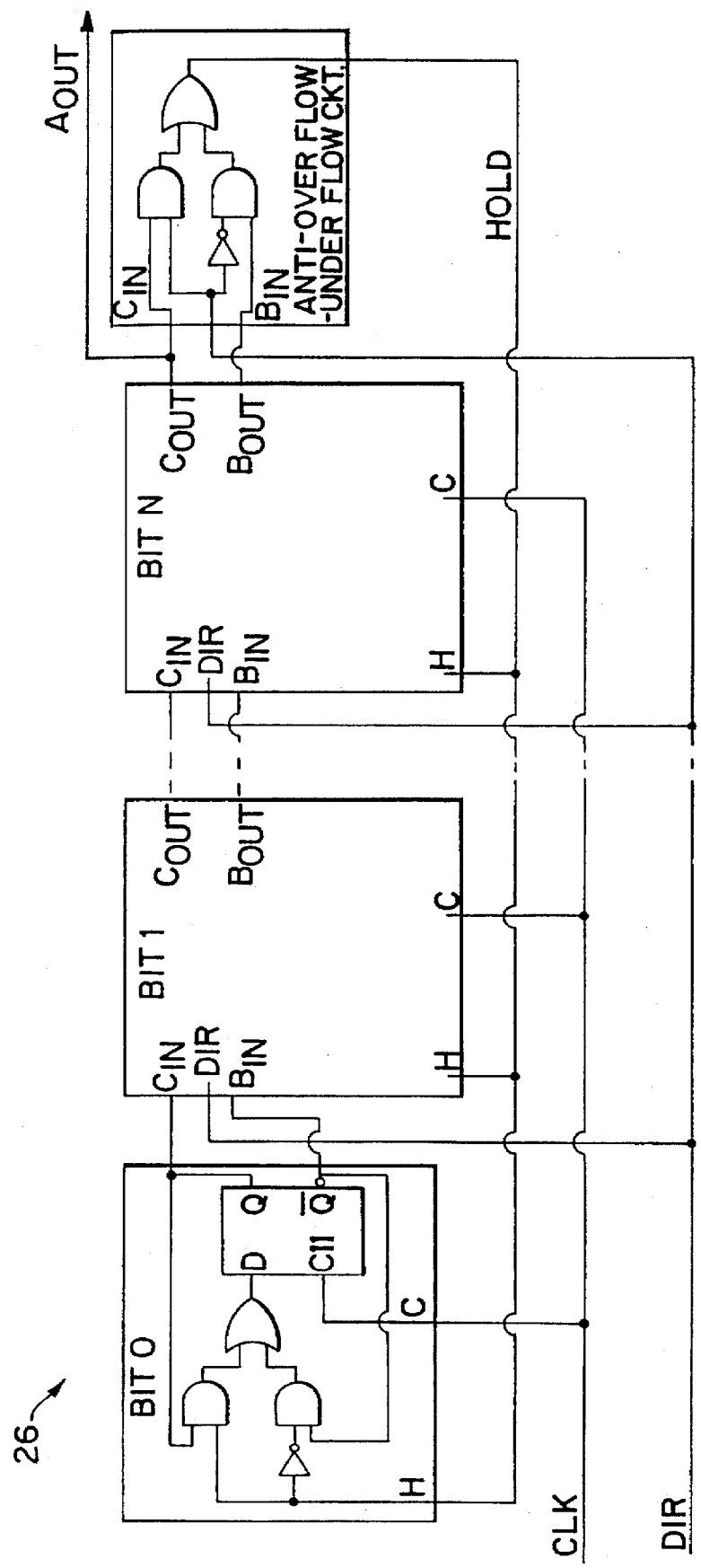
FIG. 4 shows a circuit diagram the up-down counter employed in the two-terminal magnetic-field detector of FIG. 2, wherein the counter stages beyond the first bit are shown as blocks.

The up-down counter 26 of FIG. 2 may consist of binary bit stages, bit 0, bit 1 ... and bit N, as illustrated in FIG. 4. The clock signal (CLK) is obtained from clock 28. Counter stages bit 1 through bit N are constructed as shown in FIG. 5. As seen in FIG. 4, all bit stages produce a binary carry signal Cout and a binary borrow Bout signal that is fed to the corresponding inputs Cin and Bin of the following bit stage. The Cout signal, from the last counter stage bit N, serves as the output signal from counter 26.

The count direction signal (DIR) comes from the output of the comparator 24. When the magnet has moved adjacent the integrated circuit detector chip 20, and the output signal DIR of the comparator 24 changes from a low to a high state, the counter 26 begins to count in the upward direction. When due to a slosh the magnet moves away and the DIR signal goes to a low state, the counter 26 begins to count downward. When the accumulated count exceeds the maximum upward count of counter 26, the counter output signal $A_{out}$ goes high, resetting flip flop 30 and turning on the Darlington driver transistors 35 and 36.

An anti-overflow -under flow circuit 70 is employed in the counter 26 shown in FIG. 4 to prevent upward counting beyond the maximum count (a count of 32 in this example for the five bit counter) and to prevent downward counting below zero count.

The synchronous up-down counter 26 counts up to its maximum and holds. The ripple carry out bit signal from each bit stage continues onto the next stage. When the counter reaches maximum count, the last carry out bit is asserted which is used to generate a high hold signal, HOLD. A high HOLD signal is needed to prevent the counter from overflowing and wrapping around to zero. When the counter is commanded to count back down, the HOLD signal goes low (releasing the bit stages). Likewise the counter 26 is prevented from counting down to zero and then wrapping by the hold signal from the anti-overflow -underflow circuit 70.

Figure 9:
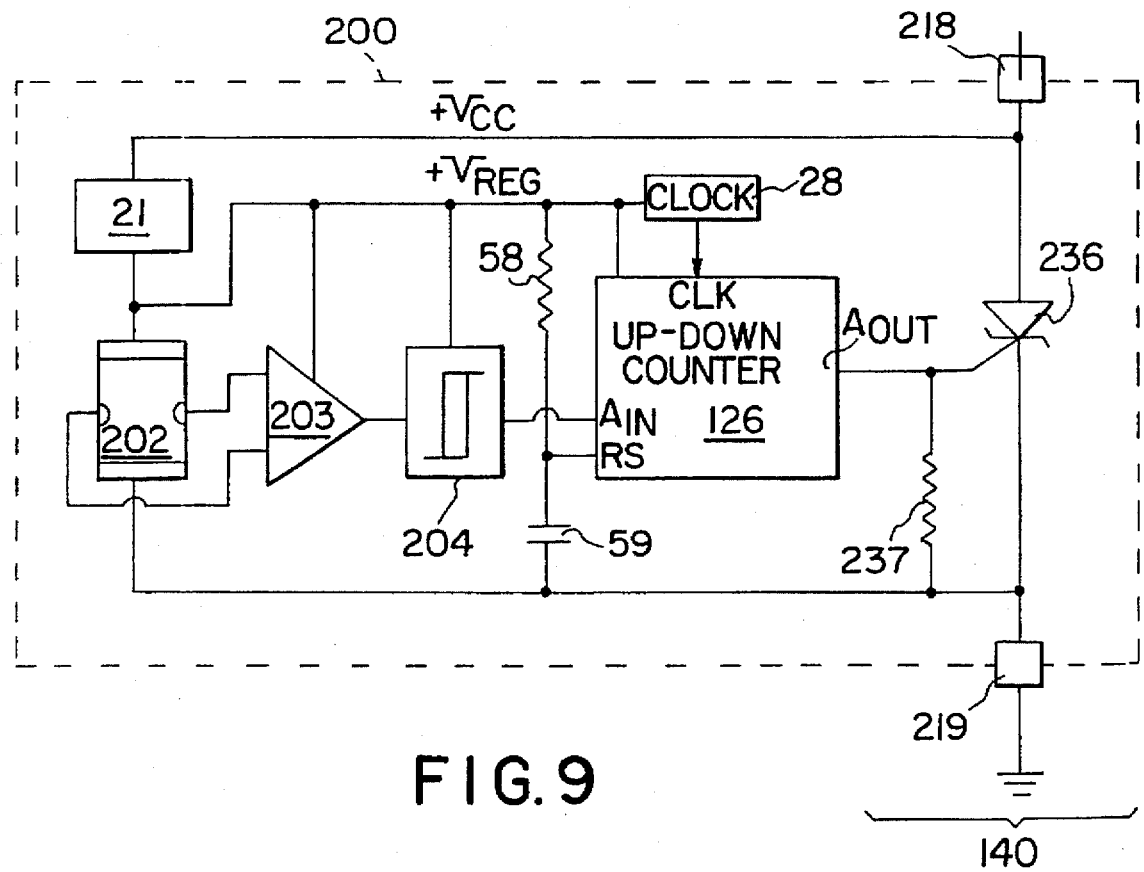
FIG. 9 shows a circuit diagram of a second preferred two-terminal integrated circuit magnetic-field detector of this invention.

In a second embodiment of this invention illustrated in FIG. 9, a two terminal integrated silicon circuit chip 200 has a magnetic-field-to-voltage transducer that is a Hall element 202 with an output connected to a Hall voltage amplifier 203 having an output connected to the input of a Schmitt comparator 204. Comparator 204 provides a binary output signal that is high when a magnet approaches and the ambient magnetic field is strong enough that the transducer output exceeds the operate threshold voltage of the comparator 204. The comparator output becomes low, or zero, when the magnet is far enough away that the transducer output is lower than the release threshold of comparator 204.

The output of comparator 204 is connected to the clocked up-down counter 126, which is the same counter 26 that is employed in the circuit of FIG. 2. Clock pulses are provided to the counter 26 from a free running clock 28, and the up-down counter 26 performs the same function in the same way as described above with reference to the circuit of FIG. 2. The circuit of FIG. 9 differs from that of FIG. 2 by having a thyristor 236 connected between the two integrated circuit chip terminal pads 218 and 219. This integrated thyristor 236 serves with the aid of gate resistor 237 as latch and switch, or latching switch.

When the count in counter 126 reaches the count of 32, the gate of the thermistor 236 goes high and the thyristor turns on. This causes the voltage between the terminal pads to drop from a Vcc of 12 volts to near zero volts, and the thyristor remains latched on until the DC voltage source is disconnected from the circuit.

Figure 10:
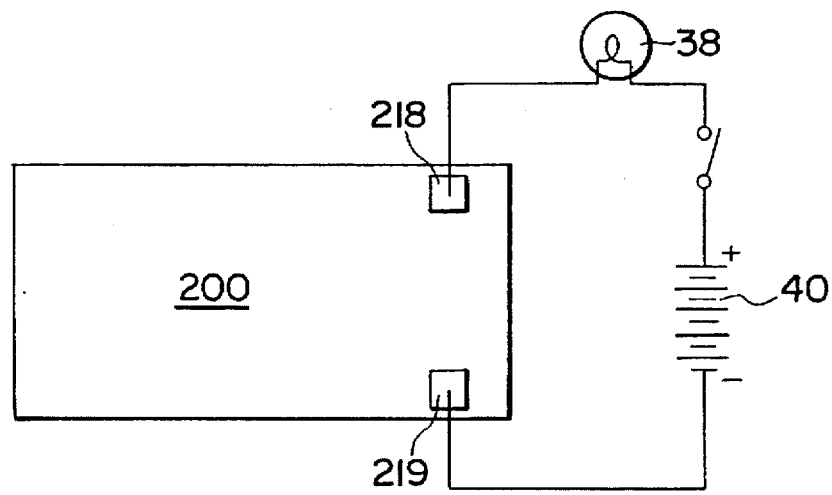
FIG. 10 shows a circuit diagram of the external circuit connected to the integrated circuit of FIG. 9 to form the entire electrical portion of a liquid level sensing detector.

In FIG. 10, the external circuit that is connected to the two terminal pads 218 and 219 of chip 200 is shown to consist of an ignition switch 242, a battery 40 and the lamp 38.

The circuitry shown to the right of the up-down counter 126 in FIG. 9 may be considered a latching driver 140 that turns on when a binary signal exceeding a given level is momentarily applied to the latching driver input (e.g. the gate of the thyristor 236).

Figure 11:
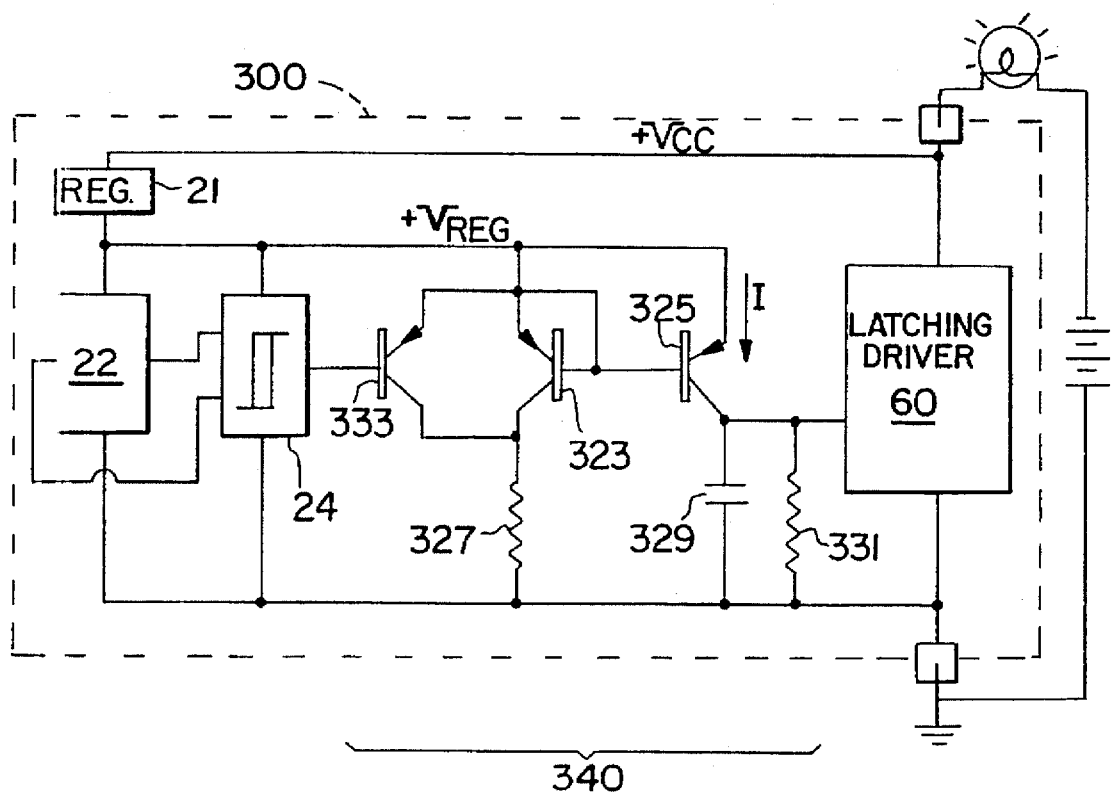
FIG. 11 shows a circuit diagram of a third preferred two-terminal integrated circuit magnetic-field detector of this invention.

In a third embodiment of this invention illustrated in FIG. 11, a two terminal integrated silicon circuit chip 300 has an on-board DC voltage regulator 21 for producing a regulated voltage $V_{reg}$. Chip 300 also has a magnetic-field-to-voltage transducer 22 with an output connected to a comparator 24. Comparator 24 provides a binary output signal that is high when a magnet approaches and the ambient magnetic field is strong enough that the transducer output exceeds the operate threshold voltage of the comparator 24. The comparator output becomes low, or zero, when the magnet is far enough away that the transducer output is lower than the "release" threshold of comparator 24.

The output of comparator 24 is connected to an up-down accumulator 340, which in this embodiment is an analog integrator. This up-down accumulator, or analog integrator, has a current source including current source transistors 323 and 325 and the current determining resistor 327. The current source charges a capacitor 329 which is paralleled by resistor 331. Transistor 333 is connected collector-to-collector and emitter-to-emitter with transistor 323 and has a base connected to the output of the comparator 24.

When the comparator output signal is low, transistor 333 is held turned on disabling by shunting the current-source transistor 323 and preventing charging the capacitor 329. When the comparator signal is high, transistor 333 is held off and the capacitor 329 is charging (up-accumulating) at a rate determined by the values of resistors 327 and 331 and the capacitance of capacitor 329. When transistor 333 is held turned off the charge on the capacitor drains off through resistor 331 (down-accumulating). The voltage across the capacitor 329 is therefore a measure of accumulated charge, and thus accumulated on-time (high output signal) of comparator 24, analogous to the count or digital accumulation shown in FIG. 7 for the circuit of FIG. 2.

Although the latching driver 60 of FIG. 2 is employed in the chip 300 of FIG. 11, other integrated-circuit latching drivers may be used provided they are capable of sustained on-operation while drawing down the DC supply voltage across the two chip terminals to less than 1.5 volts, above which the illumination of a driven incandescent warning lamp would be severely diminished.

Figure 12:
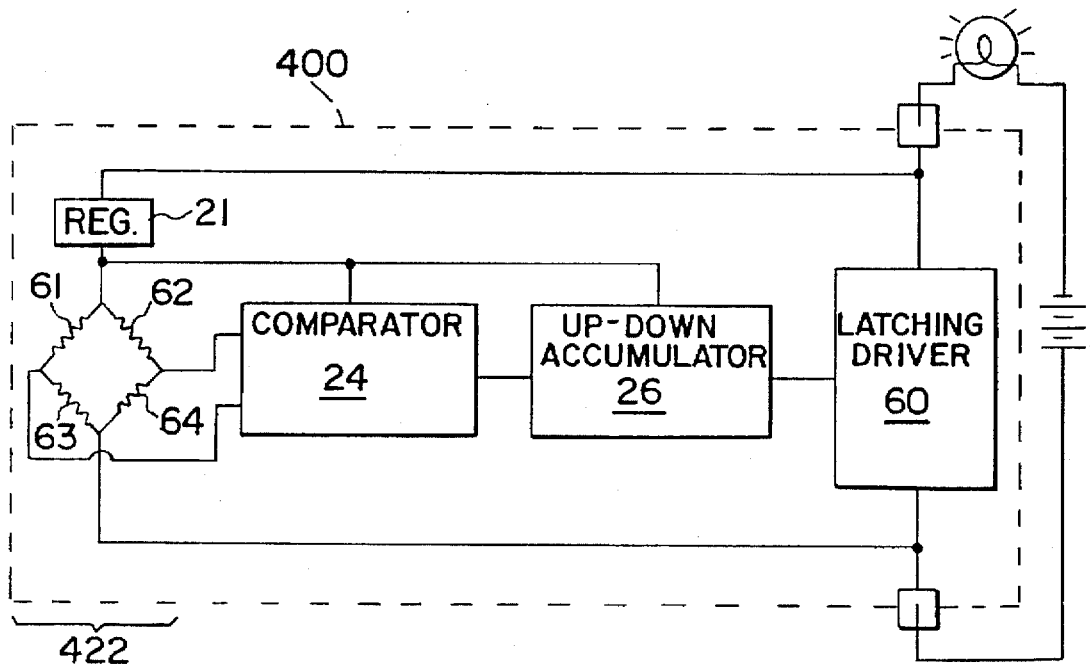
FIG. 12 shows a circuit diagram of a fourth preferred two-terminal integrated circuit magnetic-field detector of this invention.

In a fourth embodiment of this invention illustrated in FIG. 12, a two terminal integrated silicon circuit chip 400 is nearly identical to chip 20 in FIG. 2, including comparator 24, up-down accumulator 26, and latching driver 60, but specifically including a magneto-resistors magnetic-field-to-voltage transducer 422. The magneto-resistance-bridge transducer 422 includes four integrated magneto-resistors 61, 62, 63 and 64, and operation of this two terminal integrated circuit chip 400 is essentially the same as that of Hall element 22 in chip 20 of FIG. 2.

We claim:

1. A two-terminal integrated circuit magnetic-field detector for use in detecting the proximity of a floating magnet, comprising:

a) a magnetic-field-to-voltage transducer;

b) a comparator of the kind having hysteresis, for producing a one type binary output signal when the comparator input voltage exceeds one comparator threshold voltage and for producing the other type binary output signal when the transducer output voltage falls below the other predetermined threshold voltage, said comparator having an input connected to the output of said transducer;

c) an anti-sloshing accumulator means, having an input connected to said comparator output, for producing an accumulator signal that is the integral as a function of time of the binary comparator output signal when the binary comparator output signal is of the one type, and for reducing the integrated accumulator signal at a predetermined rate during periods when the binary comparator output signal is of the other type;

d) two integrated circuit terminal pads to which an external DC voltage source may be connected in series with an external warning lamp; said magnetic-field-to-voltage transducer, said comparator and said up-down accumulator means being connected to said two terminal pads for being energized by the external DC voltage source; and e) a latching driver connected between said two integrated circuit terminal pads and having an input connected to said accumulator means, said driver having a latch threshold for presenting a high impedance across said two terminal pads when the accumulator signal is in one binary state and for presenting a low impedance across said two terminal pads when the magnitude of the accumulator signal exceeds a predetermined value.

2. The two-terminal magnetic-field detector of claim 1 wherein said anti-sloshing accumulator means is comprised of a clock for generating a stream of pulses and an up-down counter connected to said counter for counting the pulses in an additive direction when the binary comparator output signal is of the one type whereby the count signal is the accumulator signal, for counting the pulses in the subtractive direction when the binary comparator output signal is of the other type, and for producing a binary accumulator output signal of one binary type to said latching driver only when the magnitude of the accumulator signal exceeds the predetermined value.

3. The two-terminal magnetic-field detector of claim 2 wherein said accumulator means is additionally for stopping accumulation whenever the accumulator output signal falls to zero and holding the output at zero until the next one type binary signal from said comparator appears at said accumulator input.

4. The two-terminal magnetic-field detector of claim 2 wherein said accumulator means is additionally for stopping accumulation whenever the accumulator count signal reaches the predetermined count value and holding the accumulator output signal at the one binary type level until the next other type binary signal from said comparator appears at said accumulator input.

5. The two-terminal magnetic-field detector of claim 1 wherein said up-down accumulator means is comprised of a charging capacitor, a current source circuit having an output connected to said charging capacitor, an enabling circuit means having an input serving as said accumulator input which is connected to said comparator output, said enabling circuit means connected to said current source circuit for enabling the charging of said capacitor by said current source when the binary output signal from said comparator is the other binary type, and for preventing the charging of said capacitor by said current source when the binary output signal from said comparator is the one binary type, a resistor connected in parallel with said charging capacitor for said reducing of the integrated accumulator signal at the predetermined rate during periods when the binary comparator output signal is of the other type, the accumulated voltage on said capacitor being said accumulator signal and said accumulator signal being said accumulator output signal that is presented to said latching driver input.

6. The two-terminal magnetic-field detector of claim 1 wherein said latching driver is comprised of a pair of bipolar Darlington driver transistors connected directly across said two integrated circuit terminals; so that when said Darlington transistors are turned on, the voltage between said two integrated circuit terminals is held at the sum of the voltages across the base-emitter junctions of the two Darlington transistors, namely at about 1.2 volts.

7. The two-terminal magnetic-field detector of claim 6 wherein said latching driver is additionally comprised a set-reset flip flop having an output connected to the base input of said Darlington transistors, and having a reset input and a set input, one of said inputs serving as said latching driver input which is connected to the output of said accumulator.

8. The two-terminal magnetic-field detector of claim 7 wherein said flip flop is connected directly to said two integrated circuit terminals from which it is energized, and said flip flop is capable of normal operation at an energizing voltage of as low as 1.2 volts.

9. The two-terminal magnetic-field detector of claim 7 wherein said latching driver is additionally comprised of a series circuit branch means including a resistor and a capacitor connected between said two integrated circuit terminals, the other of said flip flop inputs being connected to the junction of said resistor and capacitor for when a DC voltage is first applied to said two integrated circuit terminals, said flip flop always initially assumes the particular bipolar state which holds said Darlington drivers off.

10. The two-terminal magnetic-field detector of claim 1 wherein said magnetic-field-to-voltage transducer is comprised of a Hall element having an output connected to a Hall voltage amplifier.

11. The two-terminal magnetic-field detector of claim 1 wherein said magnetic-field-to-voltage transducer is comprised of a magneto-resistor bridge circuit having an output connected to a bridge voltage amplifier.

12. The two-terminal magnetic-field detector of claim 1 wherein said latching driver is comprised of a silicon controlled rectifier.

* * * * *